United States Patent [19]
Hasleberg

[11] Patent Number: 5,323,081
[45] Date of Patent: Jun. 21, 1994

[54] SURFACE ACOUSTIC WAVE DEVICE CLAMPED WITHIN HOUSING

[75] Inventor: Harald Hasleberg, Skien, Norway

[73] Assignee: AME Space AS, Horten, Norway

[21] Appl. No.: 894,364

[22] Filed: Jun. 4, 1992

[30] Foreign Application Priority Data

Jun. 28, 1991 [NO] Norway ................................ 2550/91

[51] Int. Cl.$^5$ .......................................... H01L 41/08
[52] U.S. Cl. .................................. 310/313 R; 310/348
[58] Field of Search ........................... 310/313 R, 348; 333/195

[56] References Cited

U.S. PATENT DOCUMENTS

| | | | |
|---|---|---|---|
| 3,916,348 | 10/1975 | Toda et al. | 310/313 R |
| 4,357,554 | 11/1982 | Peters | 310/367 |
| 4,648,008 | 3/1987 | Neyroud et al. | 361/387 |
| 4,705,982 | 11/1987 | Besson et al. | 310/356 |
| 4,859,898 | 8/1989 | Aubry et al. | 310/353 |

FOREIGN PATENT DOCUMENTS

| | | | |
|---|---|---|---|
| 0185532 | 6/1986 | European Pat. Off. | H03H 9/10 |
| 0430652 | 6/1991 | European Pat. Off. | H03H 9/05 |
| 1291510 | 11/1989 | Japan | H03H 9/25 |

OTHER PUBLICATIONS

Review of the Electrical Communication Laboratories, vol. 25, No. 11, 1973, Tokyo-Japan; pp. 1675–1685; Minowa et al.: "Narrow Pass Band ...".

Primary Examiner—Mark O. Budd
Assistant Examiner—Thomas M. Dougherty
Attorney, Agent, or Firm—Spencer, Frank & Schneider

[57] ABSTRACT

An assembly includes a Surface Acoustic Wave (SAW) component disposed within a housing or capsule by supports which support the component close to, but not in contact with, the bottom of the housing or capsule, thereby allowing some movement of at least portions of the component within the housing or capsule.

18 Claims, 4 Drawing Sheets

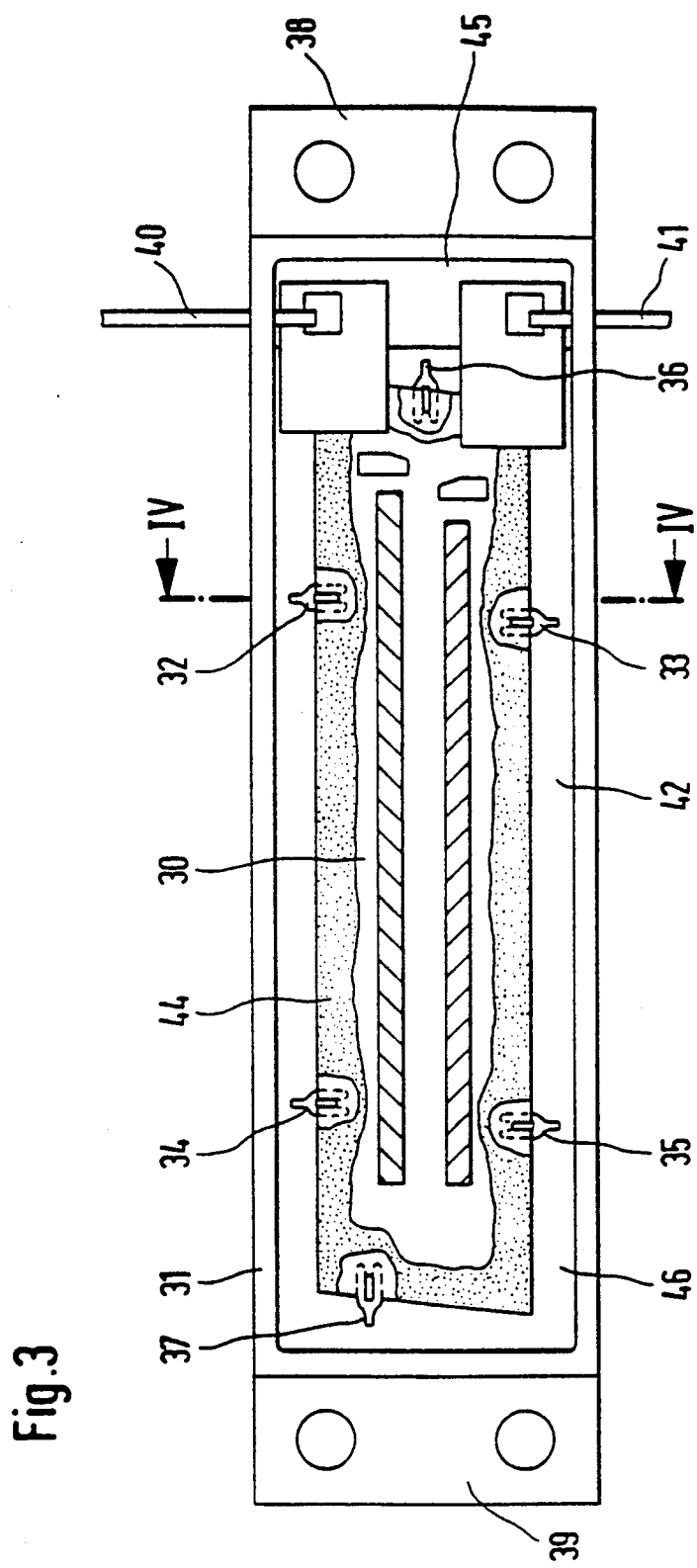

SURFACE ACOUSTIC WAVE DEVICE CLAMPED WITHIN HOUSING

CROSS-REFERENCE TO RELATED APPLICATION

This application claims the priority of Norwegian application No. 912550 filed Jun. 28th, 1991, the rights of priority of which are claimed under 35 U.S.C. 119, the application being incorporated herein by reference.

BACKGROUND OF THE INVENTION

1. Field of the Invention

The present invention relates to means for assembly longitudinal body, such as a Surface Acoustic Wave (SAW) component within a housing or capsule (package).

2. Background Information

SAW components or devices are characterized by the use of a piezoelectric crystal substrate with electro acoustic transducers, normally a metal film forming an interdigital 'finger' pattern, deposited onto the crystal surface. The transducer produces an electric field over the crystal surface when an electric signal is applied to it. This electric field is transformed into a mechanical force in the crystal, which subsequently launches an acoustic (mechanical) wave in the crystal surface.

Conversely, the transducer may convert the acoustic energy back to an electric signal. The most commonly used substrate materials are quartz, lithium niobate and lithium tantalate. These materials are, by their nature, sensitive to mechanical stress. Any mechanical stress will influence the electrical behavior of the SAW component.

SAW components usually have a longitudinal structure, i.e., the length is greater than the width, and they are usually glued along one of its surfaces to the bottom of a housing or capsule. This assembling method can be considered suitable for smaller SAW components, such as those having a length of less than 20-30 mm, and for SAW devices with moderate electric performance requirements over the operating temperature range. When larger SAW components are concerned, and when both the electrical performance requirements and the operating temperature range are demanding, other assembling means are required, in order to avoid degradation of the electrical performance of the SAW component due to mechanical stress introduced by the differential coefficient of thermal expansion between the SAW substrate and the capsule.

An alternative, well known approach is to isolate the entire SAW component and its capsule thermally, e.g., by use of a temperature controlled heater. This method is however in many cases impracticle or unacceptable for cost or other reasons.

SUMMARY OF THE INVENTION

Therefore, an object of the present invention is to provide SAW component assembling means which satisfy electrical performance requirements even under severe environmental conditions (temperature, vibration). One aim of the invention is to provide a mounting technique which
allows the SAW crystal to expand and contract with respect to the capsule without being stressed mechanically, and thereby avoid degradation of the electrical behavior of the SAW component, and simultaneously
allows the SAW component to withstand severe mechanical vibration, e.g., as experienced in satellites during their launch, and in missiles and aircraft.

In one embodiment of the invention the longitudinal component, SAW, is assembled within a housing or capsule using means for supporting the component close to, but not in contact with, a bottom of the housing or capsule, thereby allowing for some movement within the housing or capsule.

With the invention there is obtained assembling means which is suitable for SAW components having a length exceeding some 20-30 mm up to some 100 to 200 mm. The width and thickness of such components are respectively in the order of 5-15 mm and 0.5-2 mm. A component having a length of 70 mm, a width of 10 mm and a thickness of 0.8 mm has been verified to withstand random vibration levels exceeding 28 grams.

BRIEF DESCRIPTION OF THE DRAWINGS

The above mentioned and other features and objects of the present invention will clearly appear from the following detailed description of embodiments of the invention taken in conjunction with the drawings, where:

FIGS. 3 and 4 show another SAW component mounted within a capsule,

DETAILED DESCRIPTION OF THE PREFERRED EMBODIMENTS

Figure 1:
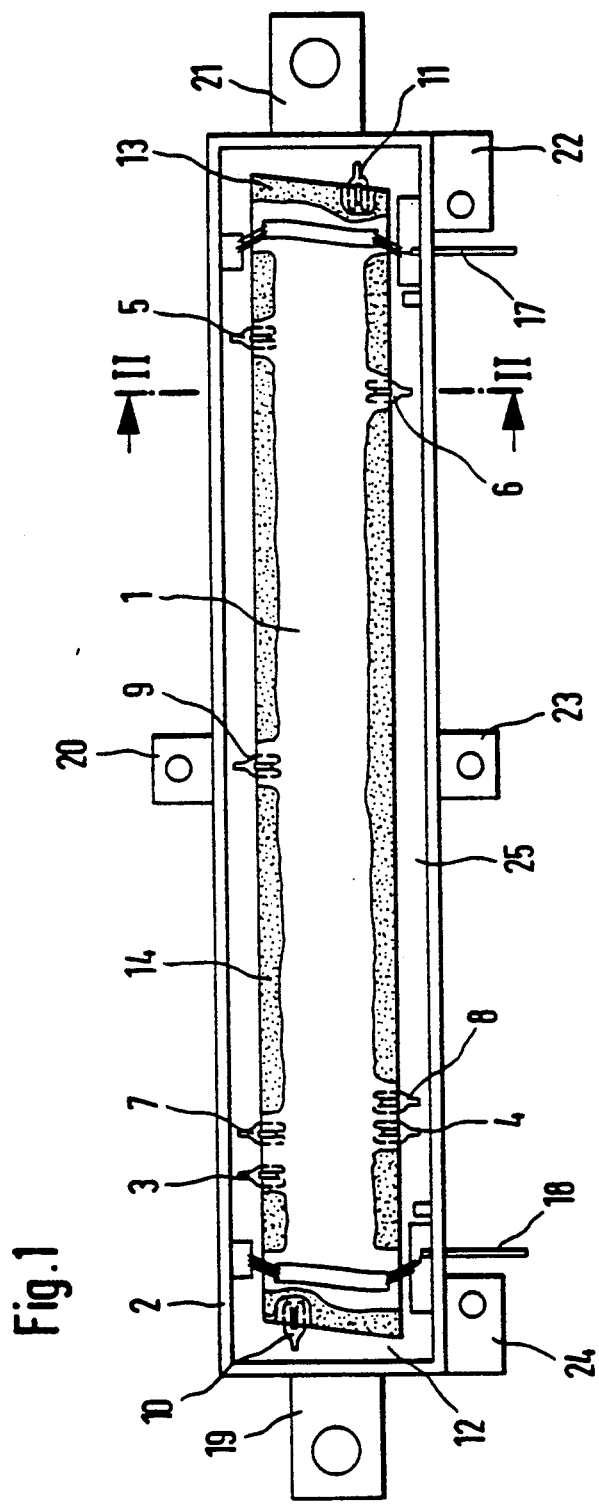
FIGS. 1 and 2 show a SAW component mounted within a capsule.

It should be noted that the components and parts are not shown to scale in any of the drawings. FIG. 1 is a schematic illustration of a SAW component 1 assembled within a housing or capsule 2 having a length of some 100 mm and a width of some 12 mm. This is a delay line component which is supported by a number of clamps 3-11. All the clamps are fixed to the capsule bottom by means of gluing, soldering, welding, brazing or other fixing method.

The component is free to move in its longitudinal direction against forces applied by the clamps. The clamps 3 and 4 (and the optional clamps 7 and 8) are socalled "hard" clamps which are each calibrated to apply a force exceeding 0.8N, to give a resulting force of some 1.6N on each side of the component against longitudinal withdrawal. If the clamps 7 and 8 are omitted the withdrawal force of the clamps 3 and 4 should be in excess of 1.2N. When using the two clamps 7 and 8 these should be placed as close as possible to the clamps 3 and 4. The clamps 5 and 6 are so called "loose" clamps which are calibrated to give a force against longitudinal withdrawal of some 0.6 to 0.8N, to allow longitudinal movements of the right part of the component. It should be noted that the clamps 3 and 7 are arranged somewhat displaced (by 0° to 10°) from the clamps 4 and 8 across the component, and so are the clamps 5 and 6. An optional supporting clamp 9 is arranged on one side of the rather long component. As a rule such side clamps are only required for components longer than some 80 mm. A corresponding clamp on the other side of the component is neither considered desirable nor necessary. Two optional "loose" clamps 10 and 11 are arranged, one in each end of the component, to prevent excessive longitudinal movement of the component. The clamps 9-11 are calibrated to give a force of some 0.1 to 0.4N against longitudinal movement of the component. As illustrated, the component is provided with recess like end portions 12 and 13 so as to save place within the capsule walls. The distance from the component ends 12, 13 to the clamps 3,4 and 5,6 is in the order of ⅛ to 1/5 of the length of the component.

On the upper side, the side edge of the SAW component 1 is provided with a layer of damping material 14. A suitable damping material can be a soft non-conducting glue. The strip of damping material is interrupted at positions where the clamps are mounted, and where terminations are made at positions 17-18. The capsule 2 is provided with a number of lugs 19-24 for securing the capsule package to some other equipment (not shown).

Figure 2:
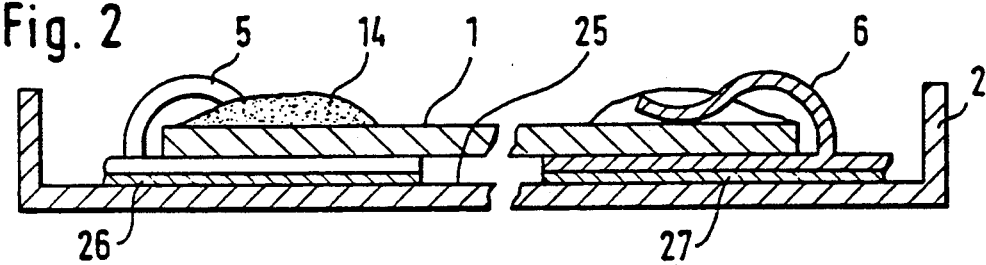

An enlarged crossection of the capsule mounted SAW component taken at line II—II through the clamp 6, is illustrated in FIG. 2. This figure shows the component 1 supported by clamps 5 and 6. These clamps are soldered, glued or by other means fixed to the capsule bottom 25. The upper side edge of the component is provided with a conventional strip of reflection damping material 14. This damping strip is interrupted at the clamps and it is therefore not shown in connection with clamp 6.

A similar crossection could be shown through the clamps 3,4,5,(6),7,8 and 9, and also in principle for the clamps 10 and 11. The end clamps 10 and 11 may be omitted if the risk of excessive longitudinal movements is negligible, or they may be substituted by other stopping means.

Figure 4:
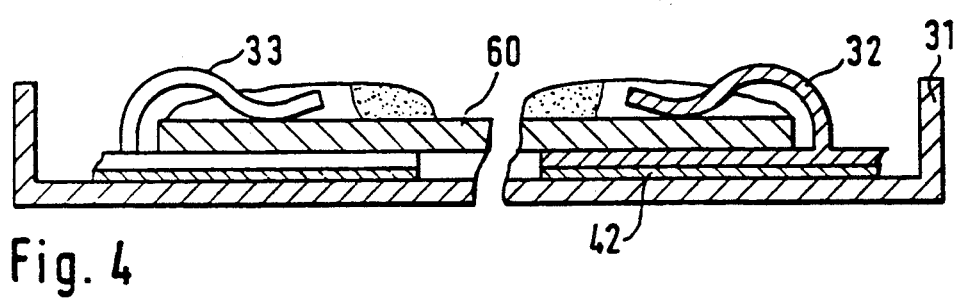

In FIG. 3 is illustrated a different type of SAW component 30 assembled within a capsule 31 having a length of some 60 mm and a width of some 18 mm. This is a chirp filter component 30 which is supported by clamps 32-37, two of which are "hard" clamps 32, 33 which are calibrated to give a withdrawal force larger than 0.7N. The "loose" side clamps 34, 35 are calibrated to a force on the order of 0.1 to 0.4N for allowing defined longitudinal movement of the left part of the SAW component. The optional "loose" end clamps 36, 37 arranged in recess like end portions 45-46 are calibrated to give 0.1 to 0.4N, to prevent excessive longitudinal movement of the component. A crossection through the clamp 32 taken along a line IV—IV in FIG. 3 is shown in FIG. 4. This crossection is similar to that shown in FIG. 2, which illustrates a crossection of FIG. 1. Similar crossections can in principle also be made through the clamps 33-35 and through clamps 36 and 37.

The capsule 31 is provided with lugs 38 and 39. Electrical connections to the SAW component are made through leads 40 and 41.

The clamps shown can be of the type having three fingers as illustrated in FIGS. 1 and 3 (and 7). Two of the fingers are fixed to the capsule bottom 25 and 42 respectively, whereas the third finger, is bent with a calibrating tool to give a desired pressure against the component 1 and 30 respectively.

Figure 5:
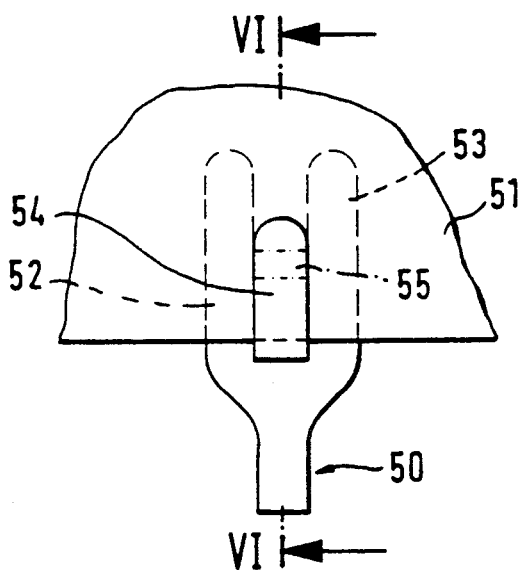
FIGS. 5 and 6 show details of a supporting clamp.
Figure 6:
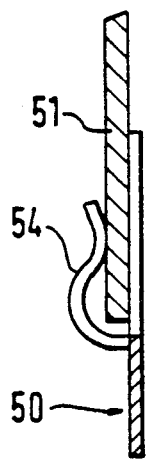

A typical clamp 50 can be made as shown in FIGS. 5 and 6 for supporting a component 51. The thickness of the clamp is 0.25 mm, the width of the fingers 52,53,54 some 0.5 mm and the length of the fingers some 2.5 mm. The thickness of the component is some 0.5 mm and its contact area 55 with the finger 54 is indicated. The clamps are preferably made of phosphor bronze. Somewhat larger clamps can be used for the long components. The crystal should be supported such that at a resonant frequency of 400-800 Hz, the maximum outswing should be 0.2 mm at a gravity of 5 g.

After being calibrated by inserting shims of defined thickness between the fingers and measuring the withdrawal force with dummy components, the clamps are cut to correct length and mounted on the component. Thereafter the clamp-component assembly is fixed to the capsule bottom with suitable means.

Figure 7:
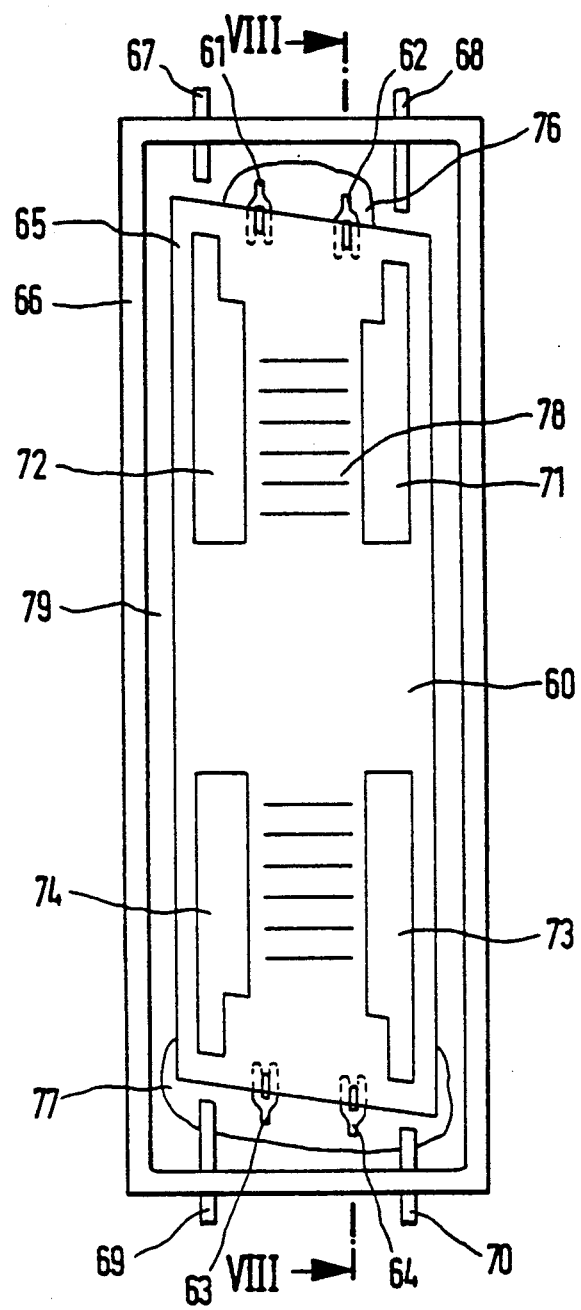
FIGS. 7 and 8 show a preferred embodiment of the invention.
Figure 8:
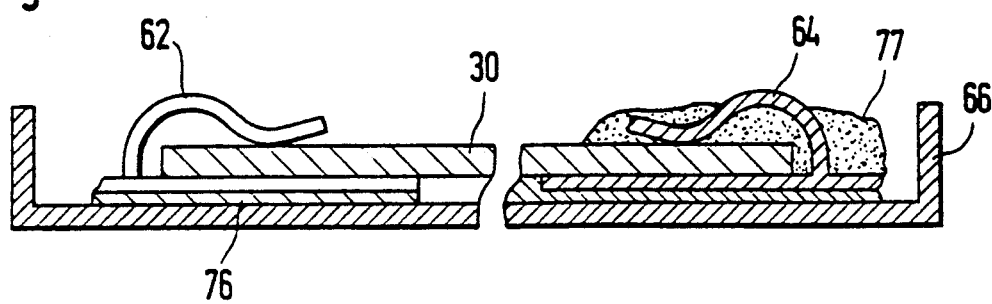

In a preferred embodiment of the invention shown in FIGS. 7, a band pass filter component 60 is supported by only four clamps 61-64 mounted at the ends of the component, with no side mounted clamps. Preferably the component should be fixed to the capsule bottom in one end by means of glued distance pieces or the glued clamps 63-64, so that the far end 65 of the component is free to move within the clamps 61-62 in the longitudinal direction. The length of this component is some 50 mm, the force of each of the clamps 61-62 is 0.1 to 0.3N whereas the force of each of the clamps 63-64 exceeds 0.6N against longitudinal withdrawal. The component is arranged within a capsule 66 through the walls of which there are terminals 67-70 leading to bonding areas 71-74 on the crystal 60. The clamps 61-62 are glued 76 to the bottom 79 of the capsule 66 to hold the crystal 60 in a similar way as shown in FIG. 2 and 4, whereas the clamps (or distance pieces) 63-64 may be fastened by glue or other fixing means 77 to the capsule bottom 79 and to the crystal as illustrated in FIG. 8. The component transducer is indicated at 78.

By arranging the clamps at the ends of the crystal only, the capsule can be less wide than when there are arranged clamps along the side of the crystal. Damping material for the SAW crystal is not shown in FIG. 7.

In FIG. 8 is illustrated a crossection through the clamps 62 and 64 in FIG. 7, taken along the line VIII—VIII.

As an alternative to calibrating the "hard" clamps 3-4, 7-8, FIG. 1 and the "hard" clamps 32 and 33, FIG. 3 to some 0.7N or more, the components 1 and 30 respectively, can be glued to these clamps and to the bottom of their capsules 2 and 31 respectively at this position. In this alternative embodiment the clamps 3-4, 7-8 and 32-33 merely function as distance pieces between the lower side of the component and the capsule bottom. Crossections of these alternatives will be similar to the crossection of clamp 64 in FIG. 8. In the components 1 and 30 are secured to the capsule bottom at the position of the 'hard' clamps, the end clamps can be omitted, thus saving place in the longitudinal direction.

With the invention and the embodiments shown the crystal components will withstand vibrations with 20–30 $g_{rms}$ at 20–2000 Hz and temperature cycling from $-25°$ C. to $+125°$ C. The operating temperature of the component is from $-25°$ C. to $+100°$ C. There is obtained a phase stability of 2° peak-to-peak within the temperature range of 125° C.

The above detailed description of embodiments of this invention must be taken as examples only and should not be considered as limitations on the scope of protection.

I claim:

1. A longitudinal assembly including a surface acoustic wave component disposed within a component housing or capsule, and support means for supporting the component close to, but not in contact with, a bottom of the housing or capsule, said support means allowing some predefined movement of at least portions of the component within the housing or capsule;

wherein the support means includes a plurality of individually calibratable clamps which are fixed to the housing or capsule bottom by one of gluing, soldering, welding, and brazing; and wherein at least two of the plurality of clamps allow longitudinal movement of the component within the housing or capsule against a first defined force.

2. The assembly according to claim 1, wherein at least two of the plurality of clamps are arranged at opposite ends of the component oriented with a longitudinal direction of the component.

3. The assembly according to claim 1, wherein at least two of the plurality of clamps are arranged at positions close to at least one end of the component oriented substantially perpendicular to a longitudinal direction of the component.

4. The assembly according to claim 1, wherein at least two of the plurality of clamps are fixed to the component with glue, these clamps being arranged close to one end of the component.

5. The assembly according to claim 1, wherein at least two of the plurality of clamps allow longitudinal movement of the component against a second defined force which is greater than the first defined force.

6. The assembly according to claim 1, wherein the first defined force is in the range of 0.1 to 0.8N.

7. The assembly according to claim 1, wherein side edges and end portions on lower and upper sides of the component are provided with a strip of damping material.

8. The assembly according to claim 1, wherein at least one of the plurality of clamps has at least one finger in contact with an upper side of the component for holding the component with a predefined force toward the bottom of the housing or capsule.

9. The assembly according to claim 2, wherein at least two of the plurality of clamps are arranged at positions close to at least one end of the component with an orientation substantially perpendicular to a longitudinal direction of the component.

10. The assembly according to claim 5, wherein the second defined force is greater than 0.6N.

11. The assembly according to claim 4, wherein the distance from the component end to the at least two clamps is in the range of from ⅛ to 1/5 of the length of the component.

12. The assembly according to claim 3, wherein at least one of the plurality of clamps is arranged at each end of the component for limiting longitudinal movement of the component.

13. The assembly according to claim 3, wherein clamps arranged at opposite sides of the component are displaced from each other in a longitudinal direction of the component.

14. The assembly according to claim 11, wherein the clamps for limiting the longitudinal movement of the component are arranged at recesses defined by end portions of the component and end portions of the housing or capsule.

15. A surface acoustic wave device, comprising:

a housing;

a surface acoustic wave component disposed in said housing; and supporting means for supporting said surface acoustic wave component in said housing so that said component is held in close proximity to a bottom surface of said housing and so that some movement of said component within said housing is permitted;

wherein the support means includes a plurality of individually calibratable clamps which are fixed to the housing bottom by one of gluing, soldering, welding, and brazing; and wherein at least two of the plurality of clamps allow longitudinal movement of the component within the housing against a first defined force.

16. The device according to claim 15, wherein said supporting means comprises first and second clamp means, said first clamp means permitting movement of said component against a first predefined force, said second clamp means permitting movement of said component against a second predefined force, wherein said second predefined force is greater than said first predefined force.

17. A surface acoustic wave device according to claim 15, wherein at least one of the plurality of clamps have at least one finger in contact with an upper side of the component for holding the component with a predefined force toward the bottom of the housing.

18. The device according to claim 16, wherein said first and said second clamp means comprise three fingered clamps having first and second fingers for fixedly contacting the bottom surface of said housing and a bottom surface of said component, and a third finger for contacting an upper surface of said component and pressing said component against said first and second fingers.

* * * * *